(12) United States Patent
Zhang

(10) Patent No.: US 8,890,300 B2
(45) Date of Patent: *Nov. 18, 2014

(54) DISCRETE THREE-DIMENSIONAL MEMORY COMPRISING OFF-DIE READ/WRITE-VOLTAGE GENERATOR

(71) Applicant: ChengDu HaiCun IP Technology LLC, ChengDu (CN)

(72) Inventor: Guobiao Zhang, Corvallis, OR (US)

(73) Assignees: ChengDu HaiCun IP Technology LLC, ChengDu, SiChuan (CN); Guobiao Zhang, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/787,787

(22) Filed: Mar. 6, 2013

(65) Prior Publication Data

US 2013/0188415 A1     Jul. 25, 2013

Related U.S. Application Data

(63) Continuation-in-part of application No. 13/591,257, filed on Aug. 22, 2012.

(60) Provisional application No. 61/529,929, filed on Sep. 1, 2011.

(51) Int. Cl.

| H01L 23/02 | (2006.01) |
| G11C 5/14 | (2006.01) |
| G11C 13/00 | (2006.01) |
| G11C 8/14 | (2006.01) |
| G11C 5/02 | (2006.01) |
| H01L 25/10 | (2006.01) |
| H01L 25/065 | (2006.01) |

(52) U.S. Cl.
CPC .......... *G11C 13/0021* (2013.01); *G11C 5/145* (2013.01); *H01L 2224/32145* (2013.01); *H01L 2225/0651* (2013.01); *H01L 2224/48227* (2013.01); *H01L 2225/06562* (2013.01); *G11C 13/004* (2013.01); *H01L 2224/32225* (2013.01); *H01L 2225/06506* (2013.01); *H01L 2225/1064* (2013.01); *H01L 2225/1023* (2013.01); *H01L 25/105* (2013.01); *G11C 8/14* (2013.01); *H01L 2224/73265* (2013.01); *H01L 2224/48145* (2013.01); *H01L 25/0657* (2013.01); *G11C 13/0069* (2013.01); *G11C 5/02* (2013.01)
USPC .......... 257/686; 257/311; 257/314; 257/315; 438/238; 438/241; 438/257; 438/262; 438/266

(58) Field of Classification Search
CPC .......... H01L 2924/00014; H01L 2224/48091; H01L 2225/06562
USPC .............. 257/296, 303, 311, 314, 315, 686; 438/238, 241, 257, 258, 262, 264, 266
See application file for complete search history.

(56) References Cited

U.S. PATENT DOCUMENTS

| 4,404,655 A | 9/1983 | Naiff |
| 4,424,579 A | 1/1984 | Roesner |

(Continued)

*Primary Examiner* — Kyoung Lee
*Assistant Examiner* — Ratisha Mehta

(57) ABSTRACT

The present invention discloses a discrete three-dimensional memory (3D-M). Its 3D-M arrays are located on at least one 3D-array die, while its read/write-voltage generator ($V_R/V_W$-generator) is located on a separate peripheral-circuit die. The $V_R/V_W$-generator generates at least a read and/or write voltage to the 3D-array die. A single $V_R/V_W$-generator die can support multiple 3D-array dies.

20 Claims, 10 Drawing Sheets

(56) References Cited

U.S. PATENT DOCUMENTS

| | | |
|---|---|---|
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,385,074 B1 | 5/2002 | Johnson et al. |
| 6,515,888 B2 | 2/2003 | Johnson et al. |
| 6,587,387 B1 | 7/2003 | Fan et al. |
| 6,731,011 B2 | 5/2004 | Verma et al. |
| 6,773,937 B1 | 8/2004 | Ho et al. |
| 7,149,119 B2 | 12/2006 | Fasoli |
| 7,219,271 B2 | 5/2007 | Kleveland et al. |
| 7,383,476 B2 | 6/2008 | Crowley et al. |
| 7,675,802 B2 | 3/2010 | Kagan et al. |
| 7,696,812 B2 | 4/2010 | Al-Shamma et al. |
| 7,892,865 B2 | 2/2011 | Yano et al. |
| 7,952,904 B2 | 5/2011 | Zhang |
| 8,000,121 B2 | 8/2011 | Norman |
| 8,000,134 B2 | 8/2011 | Cornwell et al. |
| 8,141,021 B2 | 3/2012 | Norman |
| 8,208,297 B2 | 6/2012 | Norman |
| 8,223,525 B2 | 7/2012 | Balakrishnan et al. |
| 2001/0055822 A1* | 12/2001 | Kato et al. ............... 438/3 |
| 2007/0263439 A1 | 11/2007 | Cornwell et al. |
| 2008/0130342 A1* | 6/2008 | Zhang ..................... 365/51 |
| 2008/0159722 A1* | 7/2008 | Zhang ................... 386/124 |
| 2010/0142289 A1* | 6/2010 | Oku ................. 365/189.09 |
| 2010/0208503 A1* | 8/2010 | Kuo ......................... 365/51 |
| 2011/0001460 A1* | 1/2011 | Buthker ................. 323/283 |

\* cited by examiner

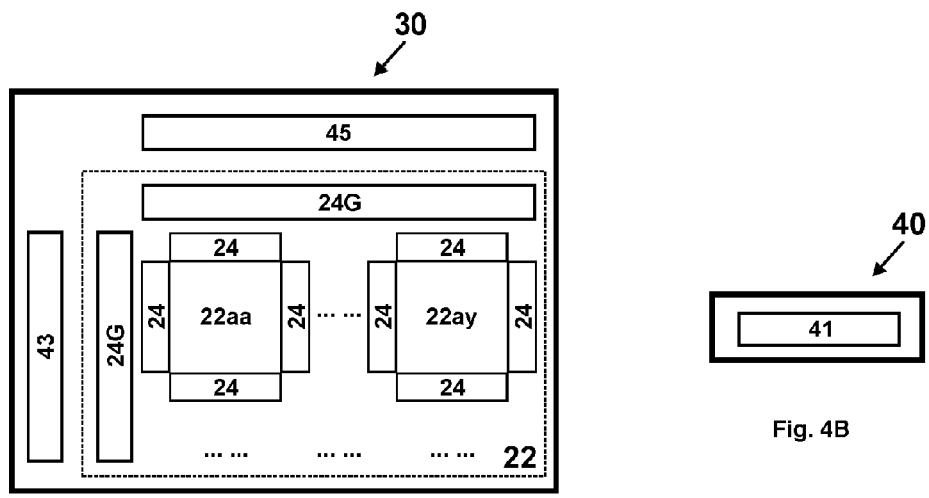
Fig. 4A
Fig. 4B
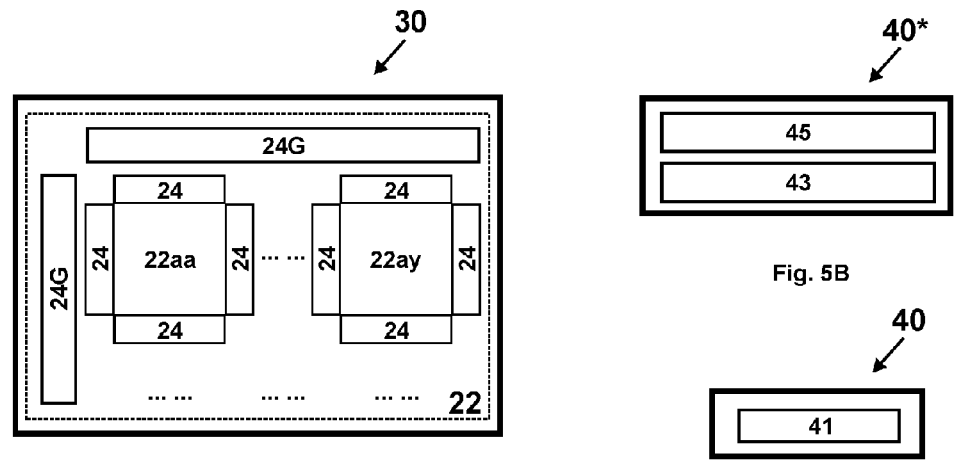
Fig. 5A
Fig. 5B
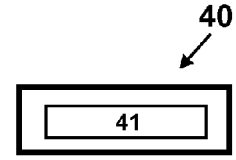
Fig. 5C

DISCRETE THREE-DIMENSIONAL MEMORY COMPRISING OFF-DIE READ/WRITE-VOLTAGE GENERATOR

CROSS-REFERENCE TO RELATED APPLICATIONS

This is a continuation-in-part of application, "Discrete Three-Dimensional Memory", application Ser. No. 13/591,257, filed Aug. 22, 2012, which relates to a provisional application, "Three-Dimensional Memory with Separate Memory-Array and Peripheral-Circuit Substrates", Application Ser. No. 61/529,929, filed Sep. 1, 2011.

BACKGROUND

1. Technical Field of the Invention

The present invention relates to the field of integrated circuit, and more particularly to three-dimensional memory (3D-M).

2. Prior Arts

Three-dimensional memory (3D-M) is a monolithic semiconductor memory comprising a plurality of vertically stacked memory levels. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). 3D-M may further comprise at least one of a memristor, a resistive random-access memory (RRAM or ReRAM), a phase-change memory, a programmable metallization cell (PMC), or a conductive-bridging random-access memory (CBRAM).

U.S. Pat. No. 5,835,396 issued to Zhang on Nov. 3, 1998 discloses a 3D-M, more particularly a 3D-ROM. As illustrated in FIG. 1A, a 3D-M die 20 comprises a substrate level 0K and a plurality of vertically stacked memory levels 16A, 16B. The substrate level 0K comprises transistors 0t and interconnects 0i. Transistors 0t are formed in a semiconductor substrate 0, while interconnects 0i, including substrate metal layers 0M1, 0M2, are formed above the substrate 0 but below the lowest memory level 16A. The memory levels (e.g. 16A) are coupled to the substrate 0 through contact vias (e.g. 1 av).

Each of the memory levels (e.g. 16A) comprises a plurality of upper address lines (e.g. 2a), lower address lines (e.g. 1a) and memory cells (e.g. 5aa). The memory cells could comprise diodes, transistors or other devices. Among all types of memory cells, the diode-based memory cells are of particular interest between they have the smallest size of ~4F², where F is the minimum feature size. Since they are generally formed at the cross points between the upper and lower address lines, the diode-based memory cells can form a cross-point array. Hereinafter, diode is broadly interpreted as any two-terminal device whose resistance at the read voltage is substantially lower than when the applied voltage has a magnitude smaller than or polarity opposite to that of the read voltage. In one exemplary embodiment, diode is a semiconductor diode, e.g. p-i-n silicon diode. In another exemplary embodiment, diode is a metal-oxide diode, e.g. titanium-oxide diode, nickel-oxide diode.

In this figure, the memory levels 16A, 16B form at least a 3D-M array 16, while the substrate level 0K comprises the peripheral circuits for the 3D-M array 16. A first portion of the peripheral circuits are located underneath the 3D-M array 16 and therefore, referred to as under-array peripheral circuit. A second portion of the peripheral circuits are located outside the 3D-M array 16 and therefore, referred to as outside-array peripheral circuits 18. Because the space 17 above the outside-array peripheral circuits 18 does not contain any memory cells, it is wasted.

U.S. Pat. No. 7,383,476 issued to Crowley et al. on Jun. 3, 2008 discloses an integrated 3D-M die 20. The integrated 3D-M die 20 comprises all necessary peripheral-circuit components in such a way that its voltage supply 23 is directly provided by a user (e.g. a host device) and its input/output 27 can be directly used by the user.

As illustrated in FIG. 1B, the integrated 3D-M die 20 comprises a 3D-array region 22 and a peripheral-circuit region 28. The 3D-array region 22 comprises a plurality of 3D-M arrays (e.g. 22aa, 22ay) and their decoders (e.g. 24, 24G). These decoders include local decoders 24 and global decoders 24G. The local decoder 24 decodes address for a single 3D-M array, while the global decoder 24G decodes address to each 3D-M array.

The peripheral-circuit region 28 comprises read/write-voltage generator ($V_R/V_W$-generator) 21 and address/data translator (A/D-translator) 29. The $V_R/V_W$-generator 21 provides read voltage $V_R$ and/or write (programming) voltage $V_W$ to the 3D-M array(s). The A/D-translator 29 converts address and data from a logical space to a physical space and vice versa. Here, the logical space is the space viewed from the perspective of a user (e.g. a host device) of the 3D-M, while the physical space is the space viewed from the perspective of the 3D-M.

The $V_R/V_W$-generator 21 includes a band gap reference generator (precision reference generator) 21B, a $V_R$ generator 21R and a charge pump 21W. Among them, the $V_R$ generator 21R generates the read voltage $V_R$, while the charge pump 21W generates the write voltage $V_W$ (referring to U.S. Pat. No. 6,486,728, "Multi-Stage Charge Pump", issued to Kleveland on Nov. 26, 2002). The prior-art integrated 3D-M die 20 generates both read voltage and write voltage internally.

The A/D-translator 29 includes address translator and data translator. The address translator converts a logical address to a physical address and vice versa, while the data translator converts a logical data to a physical data and vice versa. Hereinafter, the logical address is the address at which data appears to reside from the perspective of the user and the physical address is the memory address that is represented on the address bus of the memory. Similarly, the logical data is the data transmitted from or received by the user and the physical data is the data that are physically stored in the memory cells. Note that the logical address/data are represented on the input/output 27 of the 3D-M die 20, while the physical address/data are represented on the internal bus 25 directly coupled to the 3D-M array(s) 22.

The A/D-translator 29 of FIG. 1B includes an error checking & correction (ECC) circuit 29E, a page register/fault memory 29P and a smart write controller 29W. The ECC circuit 29E detects and corrects errors while performing ECC-decoding after data are read out from the 3D-M array(s) (referring to U.S. Pat. No. 6,591,394, "Three-Dimensional Memory Array and Method for Storing Data Bits and ECC Bits Therein" issued to Lee et al. on Jul. 8, 2003). The page register/fault memory 29P serves as an intermediate storage device with respect to the user and the 3D-M array(s) (referring to U.S. Pat. No. 8,223,525, "Page Register Outside Array and Sense Amplifier Interface", issued to Balakrishnan et al. on Jul. 17, 2012). It performs ECC-encoding before data are written to the 3D-M array(s). The smart write controller 29W collects detected errors during programming and activates the self-repair mechanism which will reprogram the data in a redundant row (referring to U.S. Pat. No. 7,219,271, "Memory Device and Method for Redundancy/Self-Repair", issued to Kleveland et al. on May 15, 2007). The prior-art integrated 3D-M die 20 performs both address translation and data translation internally.

The $V_R/V_W$-generator 21 and A/D-translator 29 are outside-array peripheral-circuit components 18. Because they occupy a large area on the 3D-M die 20, the prior-art integrated 3D-M die 20 has a low array efficiency. The array efficiency is defined as the ratio between the total memory area (i.e. the chip area used for memory) and the total chip area. In 3D-M, the total memory area ($A_M$) is the chip area directly underneath user-addressable bits (i.e. not counting bits a user cannot access) and can be expressed as $A_M = A_c * C_L = (4F^2) * C_{3D-M}/N$, where $C_L$ is the storage capacity per memory level, $A_c$ is the area of a single memory cell, $C_3D$-M is the total storage capacity of the 3D-M, F is the address-line pitch, and N is the total number of memory levels in the 3D-M. In the following paragraphs, two 3D-M dies are examined for their array efficiencies.

As a first example, a 3-D one-time-programmable memory (3D-OTP) is disclosed in Crowley et al. "512 Mb PROM with 8 Layers of Antifuse/Diode Cells" (referring to 2003 International Solid-State Circuits Conference, FIG. 16.4.5). This 3D-OTP die has a storage capacity of 512 Mb and comprises eight memory levels manufactured at 0.25 um node. The total memory area is $4*(0.25 \text{ um})^2 * 512 \text{ Mb}/8 = 16 \text{ mm}^2$. With a total chip area of 48.3 mm², the array efficiency of the 3D-OTP die is ~33%.

As a second example, a 3-D resistive random-access memory (3D-ReRAM) is disclosed in Liu et al. "A 130.7 mm² 2-Layer 32 Gb ReRAM Memory Device in 24 nm Technology" (referring to 2013 International Solid-State Circuits Conference, FIG. 12.1.7). This 3D-ReRAM die has a storage capacity of 32 Gb and comprises two memory levels manufactured at 24 nm node. The total memory area is $4*(24 \text{ nm})^2 * 32 \text{ Gb}/2 = 36.8 \text{ mm}^2$. With a total chip area of 130.7 mm², the array efficiency of the 3D-ReRAM die is ~28%.

In the prior-art integrated 3D-M, its 3D-M arrays are integrated with all of its peripheral-circuit components. The peripheral-circuit components of the 3D-M include $V_R/V_W$-generator and A/D-translator. The integrated 3D-M is thought to be advantageous based on the prevailing belief that integration will lower the overall cost of an integrated circuit. However, this belief is no longer true for 3D-M. Because the 3D-M arrays use a complex back-end process while their peripheral circuits use a relatively simple back-end process, integrating the 3D-M arrays with their peripheral-circuit components will force the peripheral-circuit components to use the expensive manufacturing process for the 3D-M arrays. As a result, integration does not lower the overall cost of the 3D-M, but actually increases it. To make things worse, because they can only use the same number of the substrate metal layers (as few as two) as the 3D-M arrays, the peripheral-circuit components are difficult to design and occupy a large chip area. Finally, because the 3D-M cells generally require high-temperature processing, the peripheral-circuit components need to use high-temperature interconnect materials, e.g. tungsten (W). This degrades the 3D-M performance.

Objects and Advantages

It is a principle object of the present invention to provide a three-dimensional memory (3D-M) with a lower overall cost.

It is a further object of the present invention to provide a 3D-M with an improved performance.

In accordance with these and other objects of the present invention, a discrete 3D-M is disclosed. The design philosophy behind the discrete 3D-M is to minimize manipulation on power supply, data and address inside a 3D-M die.

SUMMARY OF THE INVENTION

The present invention discloses a discrete three-dimensional memory (3D-M). It comprises at least a 3D-array die and at least a peripheral-circuit die. The 3D-array die comprises a plurality of 3D-M arrays, each of which is formed in a 3-D space and comprises a plurality of vertically stacked memory levels. The peripheral-circuit die is formed on a 2-D plane and comprises a single functional level. It comprises at least one of the peripheral-circuit components. The peripheral-circuit components of the 3D-M include read/write-voltage generator ($V_R/V_W$-generator) and address/data translator (A/D-translator).

Different from the integrated 3D-M where all peripheral-circuit components are located on the 3D-M die, at least one peripheral-circuit component of the discrete 3D-M is located on the peripheral-circuit die. Because the 3D-array die comprises fewer peripheral-circuit component(s), its array efficiency could be larger than 40%. By moving all peripheral-circuit components to the peripheral-circuit die, the array efficiency of the 3D-array die could reach ~60%.

Because it is manufactured using an independent process with less complex back-end, the wafer cost of the peripheral-circuit die is much less than the 3D-array die. As a result, the discrete 3D-M is less expensive than the integrated 3D-M for a given storage capacity. In addition, by using discrete 3D-M, the size of the peripheral-circuit components can be reduced. Being a separate die, the peripheral-circuit die can comprise more substrate metal layers (e.g. four vs. two) and therefore, the peripheral-circuit components on the peripheral-circuit die are easier to design and occupy less chip area. Furthermore, because the peripheral-circuit die does not require high-temperature processing, its interconnects may use high-speed interconnect materials, e.g. copper (Cu). This can improve the 3D-M performance.

The present invention discloses another preferred discrete 3D-M comprising at least a separate peripheral-circuit die and a plurality of separate 3D-array dies. The peripheral-circuit die performs $V_R/V_W$-generation and/or A/D-translation for multiple 3D-array dies. Sharing the peripheral-circuit die among multiple 3D-array dies results in further cost reduction. This preferred discrete 3D-M can be used for high-capacity memory card and solid-state storage.

The present invention discloses yet another preferred discrete 3D-M comprising a separate $V_R/V_W$-generator die and a separate A/D-translator die. The $V_R/V_W$-generator is an analog-intensive circuit, while the A/D-translator is a digital-intensive circuit. Because they are located on separate dies, these circuits can be optimized independently: the $V_R/V_W$-generator die is optimized for analog performance, while the A/D-translator die is optimized for digital performance.

BRIEF DESCRIPTION OF THE DRAWINGS

FIGS. 4A-4B disclose a first preferred partitioning scheme;

FIGS. 5A-5C disclose a second preferred partitioning scheme;

Figure 1A:
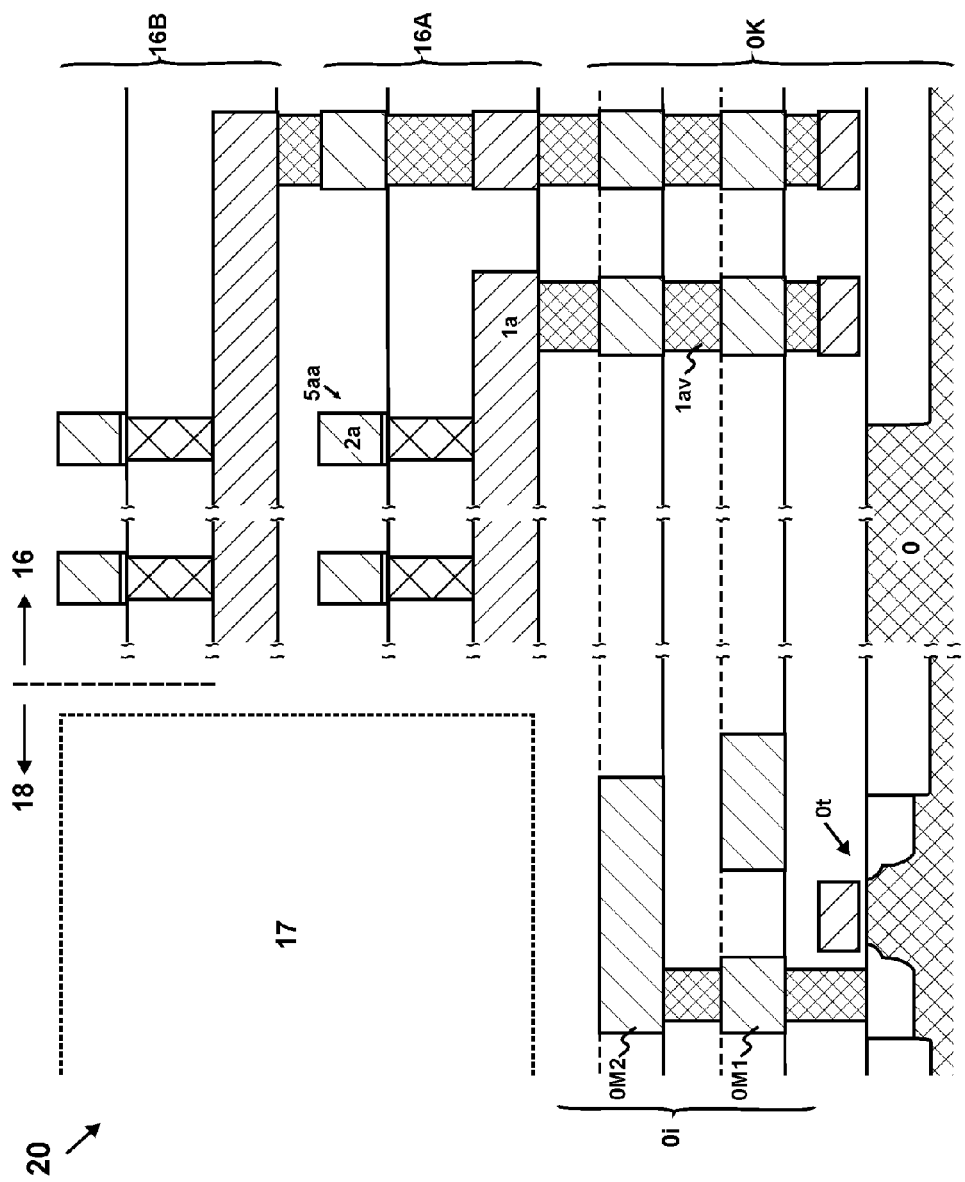
FIG. 1A is a cross-sectional view of a prior-art three-dimensional memory (3D-M)
Figure 1B:
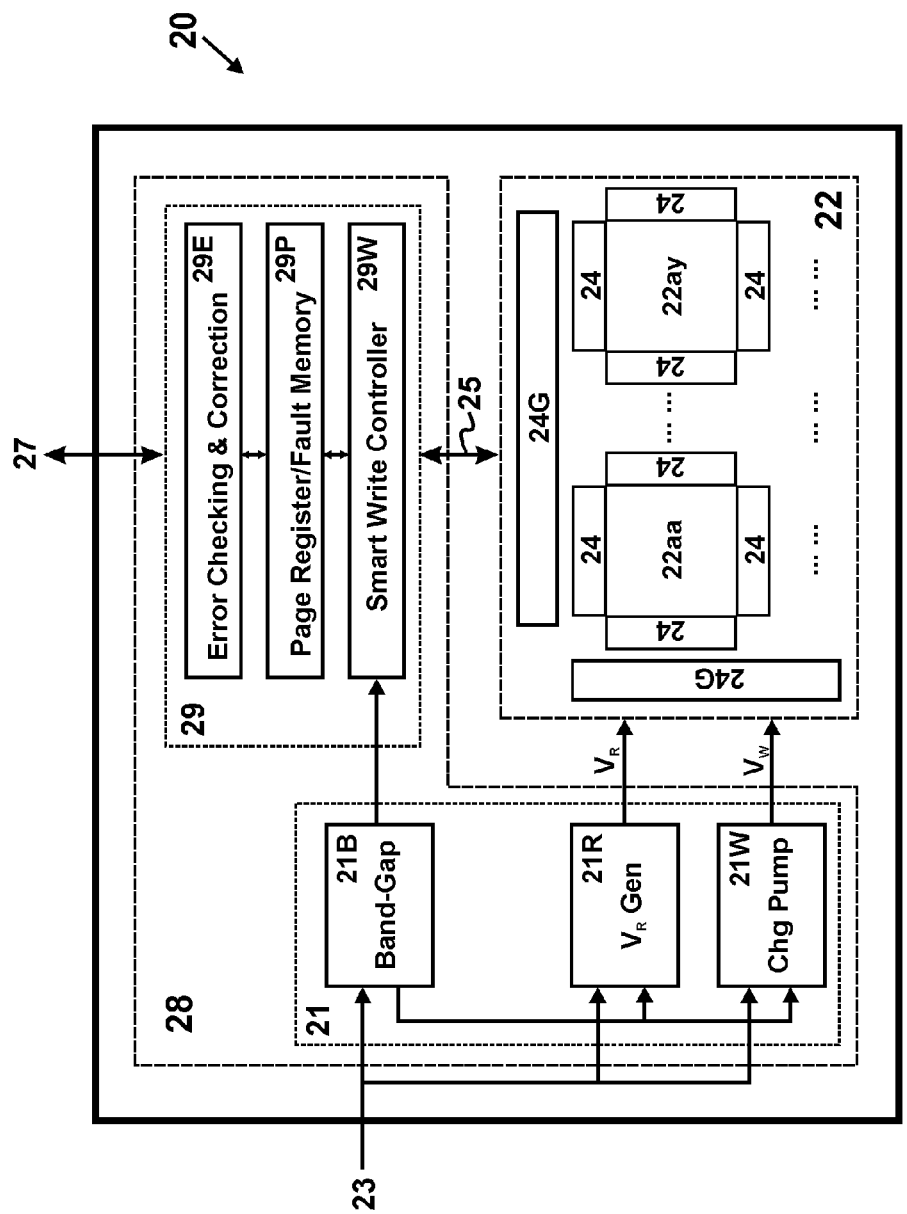
FIG. 1B is a system architecture of a prior-art integrated 3D-M die.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

In the present invention, the symbol "I" means a relationship of "and" or "or". For example, the read/write-voltage generator ($V_R/V_W$-generator) could generate either only the read voltage, or only the write voltage, or both the read voltage and the write voltage; the address/data translator (A/D-translator) could translate either only address, or only data, or both address and data.

Figure 2A:
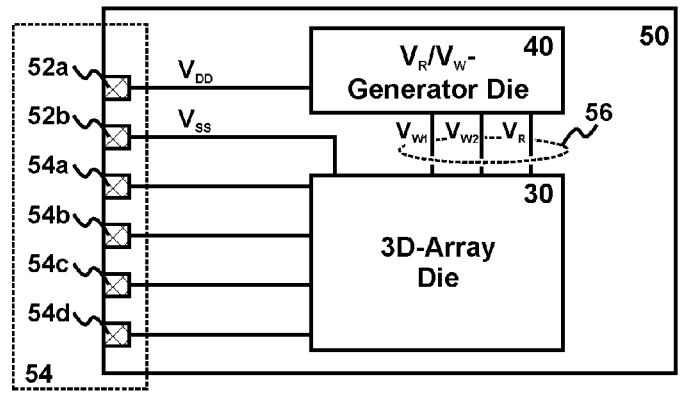
FIG. 2A illustrates a first preferred discrete 3D-M with a separate read/write-voltage generator ($V_R/V_W$-generator) die.
Figure 2B:
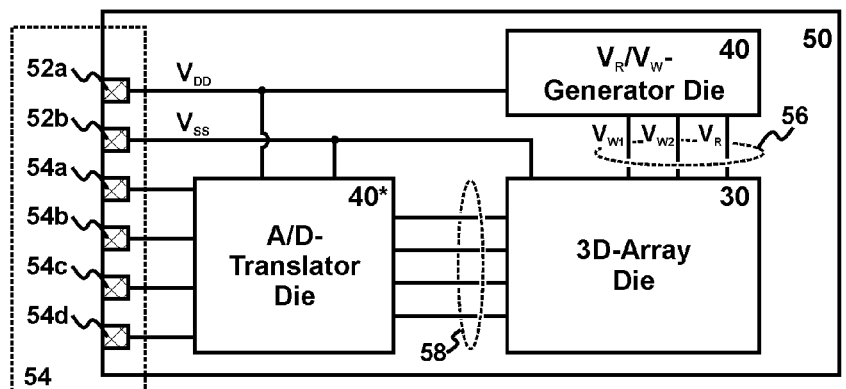
FIG. 2B illustrates a second preferred discrete 3D-M with a separate $V_R/V_W$-generator die and a separate address/data translator (A/D-translator) die.
Figure 2C:
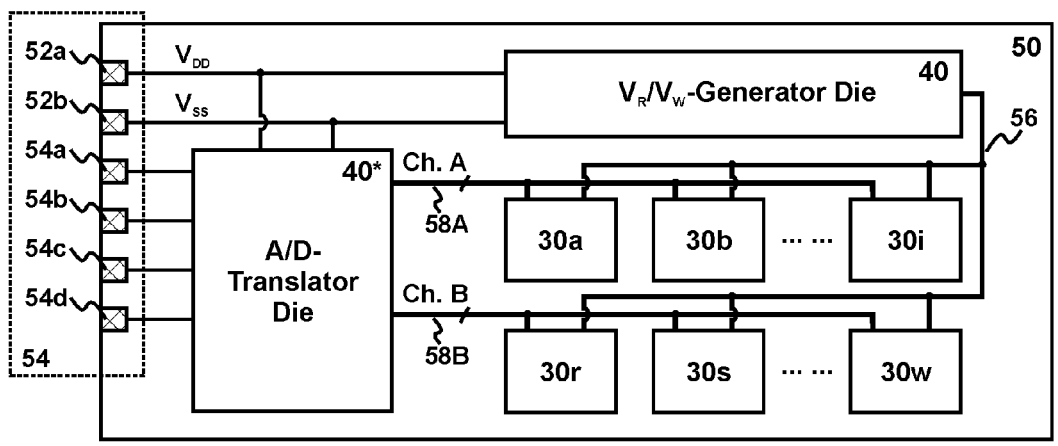
FIG. 2C illustrates a third preferred discrete 3D-M that supports multiple 3D-array dies.

Referring now to FIGS. 2A-2C, three preferred discrete three-dimensional memory (3D-M) 50 are disclosed. The discrete 3D-M 50 includes a physical interface 54 according to a standard for connecting to a variety of hosts. Physical interface 54 includes individual contacts 52a, 52b, 54a-54d that connect with corresponding contacts in a host receptacle. The power-supply contact 52a is provided to connect to a power-supply contact in the host receptacle. The voltage supplied by the host to power-supply contact 52a is referred to as voltage supply $V_{DD}$. The ground contact 52b provides a ground connection at a voltage $V_{SS}$. The contacts 54a-54d provide signal connections between the host and the discrete 3D-M 50. The signals represented on the contacts 54a-54d include address and data, among others. Because they are directly to/from the host, the address and data represented on the contacts 54a-54d are logical address and logical data.

The discrete 3D-M 50 comprises at least a 3D-array die 30 and at least a peripheral-circuit die 40. The 3D-array die 30 comprises a plurality of 3D-M arrays, while the peripheral-circuit die 40 comprises at least one of the peripheral-circuit components. The peripheral-circuit components of the 3D-M include read/write-voltage generator ($V_R/V_W$-generator) and address/data translator (A/D-translator). More details of the 3D-array die 30 are disclosed in FIGS. 3A, 4A, 5A, 6A, while more details of the peripheral-circuit die 40, 40* are disclosed in FIGS. 3B, 4B, 5B-5C, 6B-6C, and 7A-7B.

The preferred discrete 3D-M 50 in FIG. 2A is in the form of a memory card. Its peripheral-circuit die 40 is a $V_R/V_W$-generator die. The $V_R/V_W$-generator die 40 receives a voltage supply $V_{DD}$ from the power-supply contact 52a and provides the 3D-array die 30 with at least a read/write voltage through a power bus 56. The read/write voltage includes at least a read voltage and/or a write voltage other than the voltage supply $V_{DD}$. In other words, it could be either at least a read voltage $V_R$, or at least a write voltage $V_W$, or both read voltage $V_R$ and write voltage $V_W$, and the values of these read voltages and write voltages are different from the voltage supply $V_{DD}$. In this preferred embodiment, the read/write voltage includes one read voltage $V_R$ and two write voltages $V_{W1}$, $V_{W2}$. Alternatively, it could include more than one read voltage or more than two write voltages. More details on $V_R/V_W$-generator are disclosed in FIGS. 9A-9C.

The preferred discrete 3D-M 50 in FIG. 2B is also in the form of a memory card. It comprises two separate peripheral-circuit dies, i.e. a $V_R/V_W$-generator die 40 and an A/D-translator die 40*. The $V_R/V_W$-generator die 40 is similar to that in FIG. 2A. The A/D-translator die 40* converts logical address/data represented on the contacts 54a-54d to physical address/data represented on an internal bus 58 and vice versa. More details on A/D-translator are disclosed in FIGS. 10A-10B.

The preferred discrete 3D-M 50 in FIG. 2C is a solid-state drive. It comprises a plurality of 3D-array dies 30a, 30b . . . 30w. These 3D-array dies form two channels: Channel A and Channel B. The internal bus 58A on Channel A provides physical address/data to the 3D-array dies 30a, 30b . . . 30i, while the internal bus 58B on Channel B provides physical address/data to the 3D-array dies 30r, 30s . . . 30w. The power bus 56 provides read/write-voltages to all 3D-array dies 30a, 30b . . . 30w. Although two channels are used in this example, it should be apparent to those skilled in the art that more than two channels may be used in a 3D-M solid-state drive.

Figure 3A:
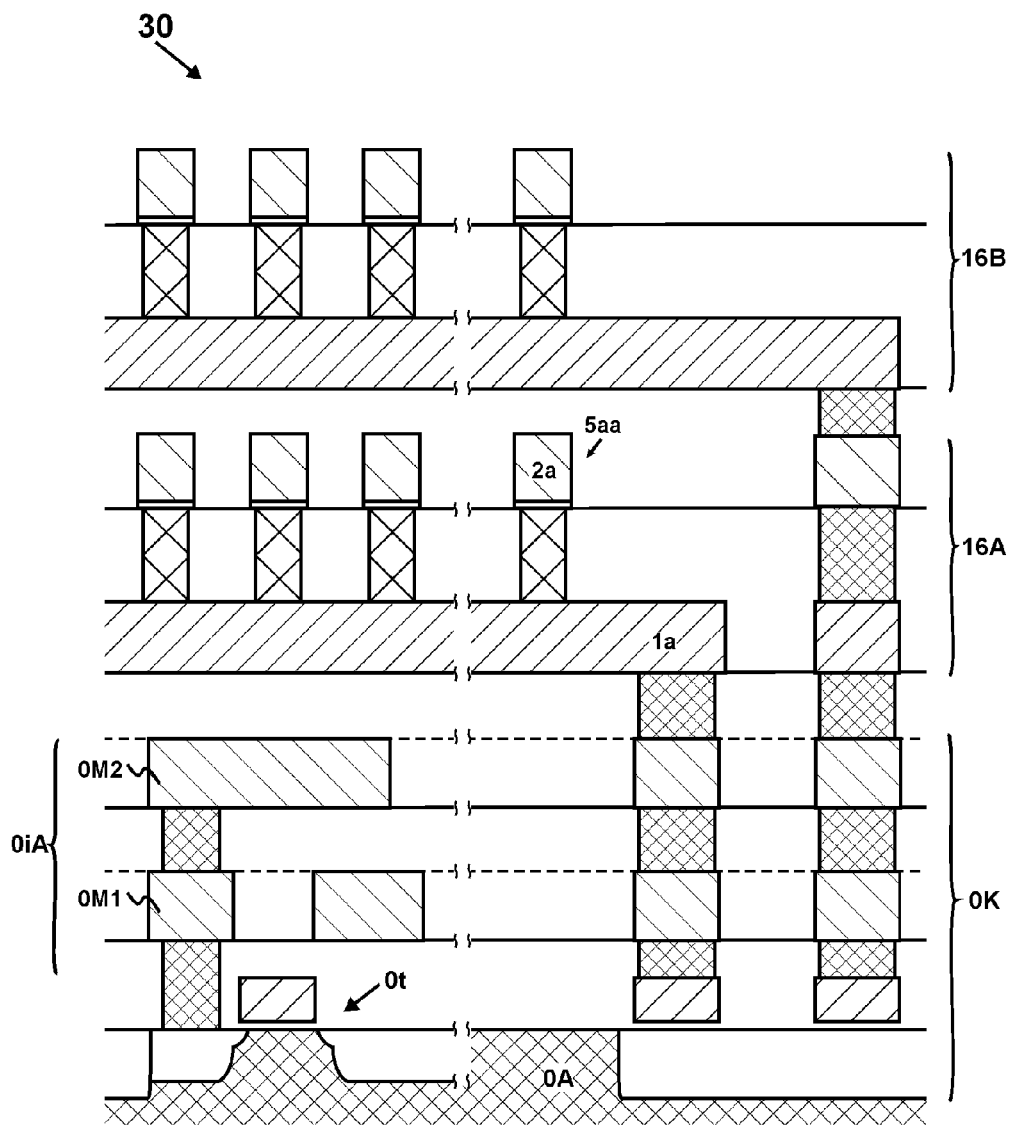
FIG. 3A is a cross-sectional view of a preferred 3D-array die.
Figure 3B:
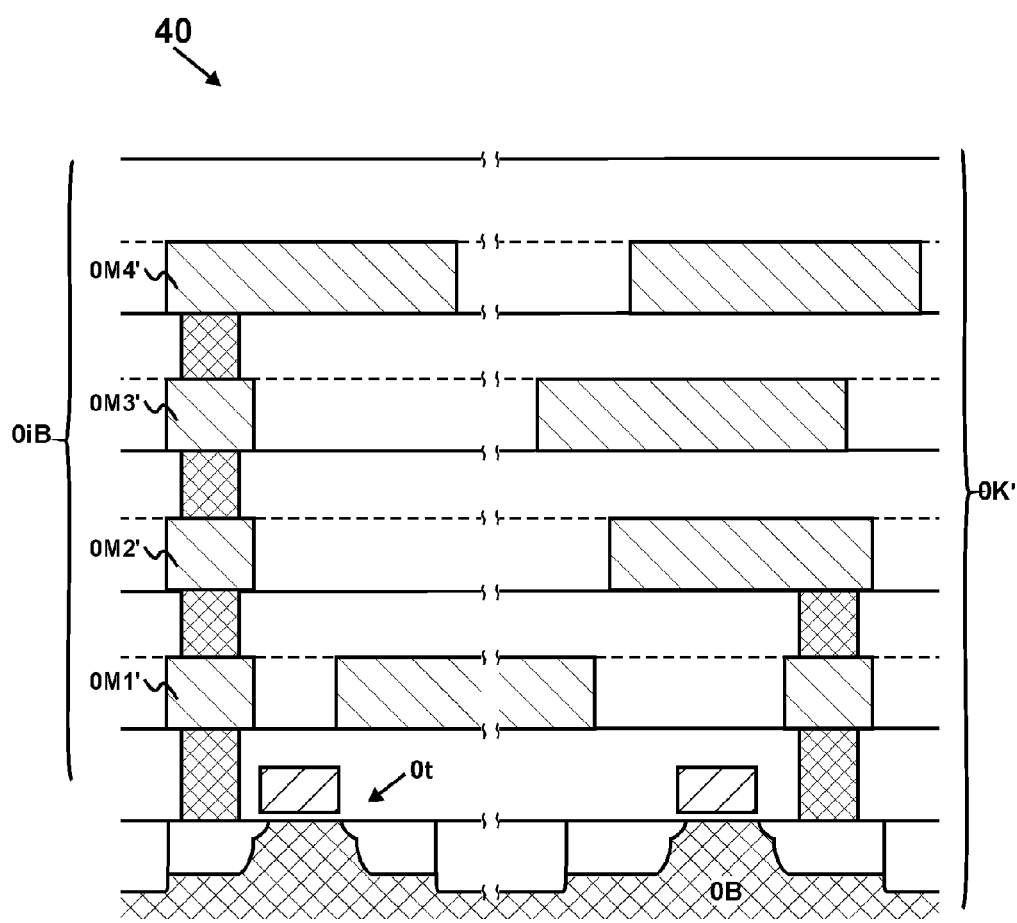
FIG. 3B is a cross-sectional view of a preferred peripheral-circuit die.

Referring now to FIGS. 3A-3B, cross-sectional views of preferred 3D-array die 30 and peripheral-circuit die 40 are illustrated. As illustrated in FIG. 3A, the preferred 3D-array die 30 is formed in a 3-D space and comprises multiple functional levels, i.e. substrate level 0K and memory levels 16A, 16B. The substrate level 0K comprises transistors 0t and interconnects 0iA. Transistors 0t are formed in a 3D-array substrate 0A. Interconnects 0iA include two substrate metal layers 0M1, 0M2. To accommodate the high-temperature process for the memory cells (e.g. 5aa), the substrate metal layers 0M1, 0M2 preferably comprise high-temperature interconnect materials, e.g. tungsten (W). The memory levels 16A, 16B and their substrate metal layers are similar to those of the 3D-M 20 of FIG. 1A.

In FIG. 3B, the preferred peripheral-circuit die 40 is formed on a 2-D plane and comprises a single functional level, i.e. the substrate level 0K'. The substrate level 0K' comprises transistors 0t and interconnects 0iB. Transistors are formed on a peripheral-circuit substrate 0B. Interconnects 0iB include four substrate metal layers 0M1'-0M4'. Because the 3D-array die 30 and the peripheral-circuit die 40 are two separate dies, the peripheral-circuit die 40 can be manufactured using an independent and less expensive process, not the expensive process for the 3D-array die 30. As a result, the wafer cost of the peripheral-circuit die 40 is significantly less than that of the 3D-array die 30.

Being a separate die, the peripheral-circuit die 40 can comprise more substrate metal layers (four vs. two) than the 3D-array die 30. Accordingly, the peripheral-circuit components on the peripheral-circuit die 40 are easier to design and occupy less chip area than those on the integrated 3D-M die 20. Furthermore, because the peripheral-circuit die 40 does not require high-temperature processing, its interconnects 0iB may use high-speed interconnect materials, e.g. copper (Cu). This can improve the performance of the peripheral-circuit die 40, as well as the performance of the 3D-M.

The discrete 3D-M becomes more advantageous when it comprises a separate $V_R/V_W$-generator die 40 and a separate A/D-translator die 40* (FIGS. 2B-2C). The $V_R/V_W$-generator is an analog-intensive circuit, while the A/D-translator is a digital-intensive circuit. Because they are located on separate dies, different manufacturing process may be used to optimize analog or digital performance separately: the $V_R/V_W$-generator die 40 can be optimized for analog performance, while the A/D-translator die 40* can be optimized for digital performance.

Different from the integrated 3D-M 20 where all peripheral-circuit components are located on the 3D-M die 20, at least one peripheral-circuit component of the discrete 3D-M 50 is located on the peripheral-circuit die 40. In other words, the peripheral-circuit components are partitioned between the 3D-array die 30 and the peripheral-circuit die 40. Several preferred partitioning schemes are disclosed in FIGS. 4A-7B.

FIGS. 4A-4B disclose a first preferred partitioning scheme. The discrete 3D-M 50 comprises a 3D-array die 30 and a peripheral-circuit die 40. In FIG. 4A, the 3D-array die 30 comprises a plurality of 3D-M arrays (e.g. 22aa, 22ay) and decoders. It also comprises address translator 43 and data translator 45. However, it does not comprise at least one peripheral-circuit component, which is $V_R/V_W$-generator 41 in this example. In FIG. 4B, the peripheral-circuit die 40 comprises the peripheral-circuit component(s) that is (are) absent in the 3D-array die 30 of FIG. 4A, i.e. the $V_R/V_W$-generator 41. Because at least one peripheral-circuit component is absent in the 3D-array die 30, the array efficiency of the 3D-array die 30 of FIG. 4A could be larger than 40%.

FIGS. 5A-5C disclose a second preferred partitioning scheme. The discrete 3D-M 50 comprises a 3D-array die 30 and two separate peripheral-circuit dies 40, 40*. In FIG. 5A, the 3D-array die 30 comprises only the 3D-M arrays (e.g. 22aa, 22ay) and their decoders. In FIG. 5B, the peripheral-circuit die 40* is an A/D-translator die, which comprises the address translator 43 and the data translator 45. In FIG. 5C, the peripheral-circuit die 40 is a $V_R/V_W$-generator die, which comprises the $V_R/V_W$-generator 41. Because all peripheral-circuit components are absent in the 3D-array die 30, the array efficiency of the 3D-array die 30 of FIG. 5A could reach ~60%.

Because it is manufactured using an independent process with less complex back-end, the wafer cost of the peripheral-circuit die 40 is much less than the 3D-array die 30. As a simple estimate, suppose the wafer cost of the peripheral-circuit die 40 is about half of the 3D-array die 30 and the array efficiency increases from 30% to 60%, the overall cost of the discrete 3D-M is ~75% of the integrated 3D-M. That is a decrease of ~25% for a given storage capacity.

Figure 6A:
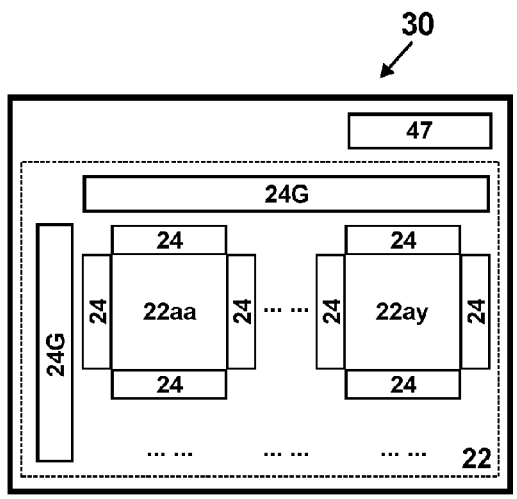
FIGS. 6A-6C disclose a third preferred partitioning scheme.
Figure 6B:
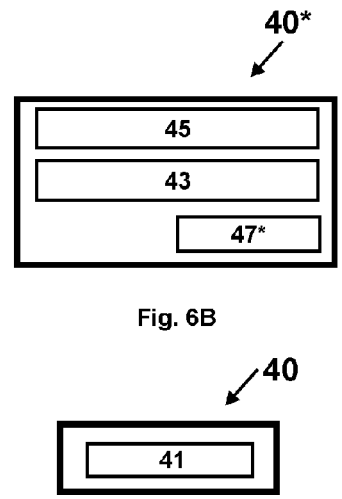
Figure 6C:
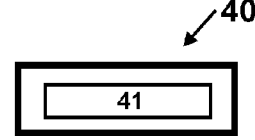

FIGS. 6A-6C disclose a third partitioning scheme. It is similar to those in FIGS. 5A-5C except that the 3D-array die 30 (FIG. 6A) further comprises a first serializer-deserializer (SerDes) 47. It converts parallel digital signals (e.g. address/data/command/status) inside the 3D-array die 30 to serial digital signals outside the 3D-array die 30 and vice versa. The A/D-translator die 40* further comprise a second serializer-deserializer (SerDes) 47*. It converts parallel digital signals (e.g. address/data/command/status) inside the peripheral-circuit die 40 to serial digital signals outside the peripheral-circuit die 40 and vice versa. By serializing digital signals, the number of bond wires (or, solder bumps) can be reduced between the 3D-array die 30 and the A/D-translator die 40*. This helps to reduce the bonding cost.

Figure 7A:
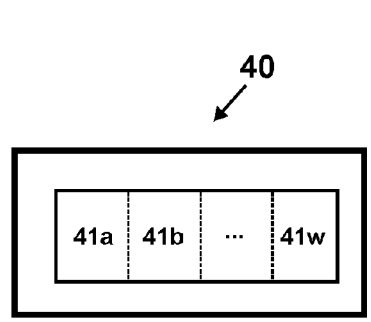
FIG. 7A is a block diagram of a preferred $V_R/V_W$-generator die for multiple 3D-array dies.
Figure 7B:
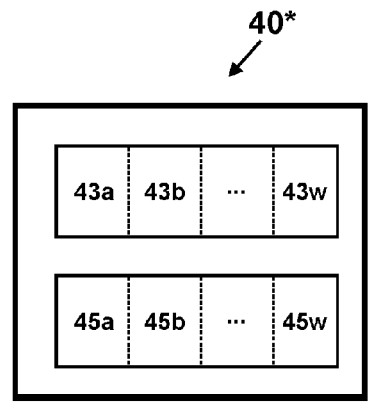
FIG. 7B is a block diagram of a preferred A/D-translator die for multiple 3D-array dies.

Referring now to FIGS. 7A-7B, the peripheral-circuit dies that supports multiple 3D-array dies are illustrated. The peripheral-circuit die 40 of FIG. 7A is a $V_R/V_W$-generator die. It comprises a plurality of $V_R/V_W$-generators 41a, 41b ... 41w. Each $V_R/V_W$-generator (e.g. 41a) provides read/write voltages to a corresponding 3D-array die (e.g. 30a of FIG. 2C). Similarly, the preferred peripheral-circuit die 40* of FIG. 7B is an A/D-translator die. It comprises a plurality of address translators 43a, 43b ... 43w and a plurality of data translators 45a, 45b ... 45w. Each address translator (e.g. 43a) and each data translator (e.g. 45a) translate address/data for a corresponding 3D-array die (e.g. 30a of FIG. 2C).

Figure 8A:
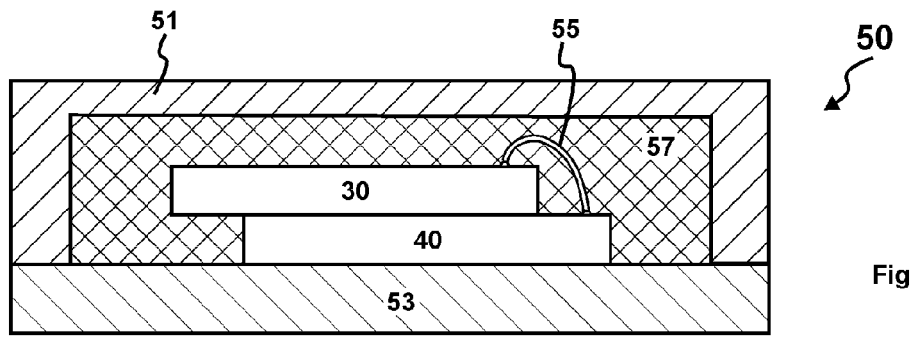
FIGS. 8A-8B are cross-sectional views of two preferred discrete 3D-M packages.
Figure 8B:
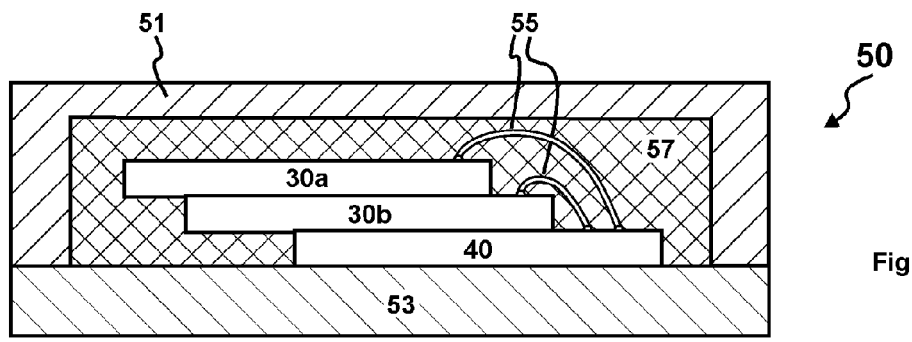
Figure 8C:
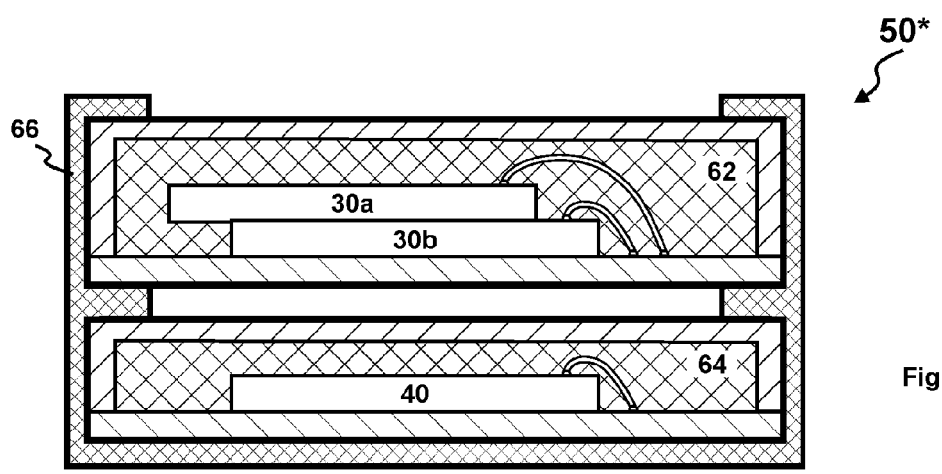
FIG. 8C is a cross-sectional view of a preferred discrete 3D-M module.

Referring now to FIG. 8A-8C, several preferred discrete 3D-M packages (or, module) 50 are disclosed. The 3D-M packages in FIGS. 8A-8B are multi-chip package (MCP). The preferred discrete 3D-M package 50 of FIG. 8A comprises two separate dies: a 3D-array die 30 and a peripheral-circuit die 40. These dies 30, 40 are vertically stacked on a package substrate 53 and located inside a package housing 51. Bond wires 55 provide electrical connection between the dies 30 and 40. Here, bond wire 55 provides a coupling means between the 3D-array die 30 and the peripheral-circuit die 40. Other coupling means include solder bump. To ensure data security, the dies 30, 40 are preferably encapsulated into a molding compound 57. In this preferred embodiment, the 3D-array die 30 is vertically stacked above the peripheral-circuit die 40. Alternatively, the 3D-array die 30 can be stacked face-to-face towards the peripheral-circuit die 40, or, the 3D-array die 30 can be mounted side-by-side with the peripheral-circuit die 40.

The preferred discrete 3D-M package 50 of FIG. 8B comprises two 3D-array dies 30a, 30b and a peripheral-circuit die 40. These dies 30a, 30b, 40 are three separate dies. They are located inside a package housing 51. The 3D-array die 30a is vertically stacked on the 3D-array die 30b, and the 3D-array die 30b is vertically stacked on the peripheral-circuit die 40. Bond wires 55 provide electrical connections between the dies 30A, 30B, and 40. The circuit block diagram of this preferred 3D-M package 50 is similar to that of FIG. 2C.

The discrete 3D-M module 50* of FIG. 8C is a multi-chip module (MCM). It comprises a module frame 66, which houses two discrete packages, i.e. a 3D-array package 62 and a peripheral-circuit package 64. The 3D-array package 62 compromises two 3D-array dies 30a, 30b, while the peripheral-circuit package 64 comprises a peripheral-circuit die 40. The module frame 66 provides electrical connections between the 3D-array package 62 and the peripheral-circuit package 64 (not drawn in this figure). The circuit block diagram of this preferred 3D-M module 50* is similar to that of FIG. 2C.

Figure 9A:
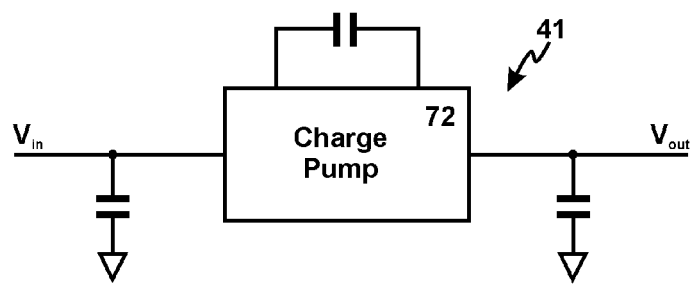
FIGS. 9A-9C are block diagrams of three preferred $V_R/V_W$-generators.
Figure 9B:
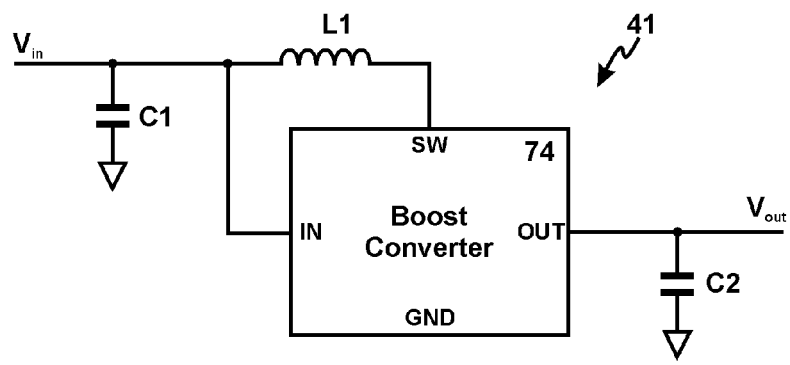
Figure 9C:
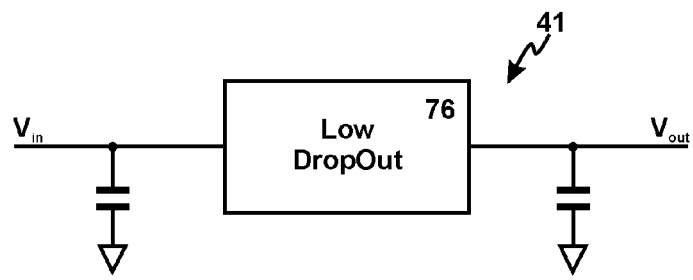

Referring now to FIGS. 9A-9C, three preferred $V_R/V_W$-generators 41 are disclosed. The $V_R/V_W$-generator 41 preferably uses a DC-to-DC converter. It could be a step-up, whose output voltage is higher than the input voltage, or a step-down, whose output voltage is lower than the input voltage. Examples of step-up include charge pump (FIG. 9A) and boost converter (FIG. 9B), and examples of step-down include low dropout (FIG. 9C) and buck converter.

In FIG. 9A, the $V_R/V_W$-generator 41 includes a charge pump 72 to provide an output voltage $V_{out}$ that is higher than the input voltage $V_{in}$. The $V_R/V_W$-generator 41 may include one or more integrated circuits and also include one or more discrete devices. Charge pump 72 may generally be formed having a low profile that fits within the physical constraints of low-profile memory cards.

In FIG. 9B, the $V_R/V_W$-generator 41 is a high frequency boost converter 74. It may also be used to generate an output voltage $V_{out}$ that is higher than an input voltage $V_{in}$. A boost converter may be formed with a low profile inductor so that the profile of the $V_R/V_W$-generator is within the limits for a memory card or a solid-state drive.

In FIG. 9C, the $V_R/V_W$-generator 41 includes a low dropout (LDO) 76 to provide an output voltage $V_{out}$ that is lower than the input voltage $V_{in}$. Generally, an LDO uses one or more (in this case, two) capacitors. Thus, the $V_R/V_W$-generator may be comprised of at least one die and may also include one or more discrete devices.

Figure 10A:
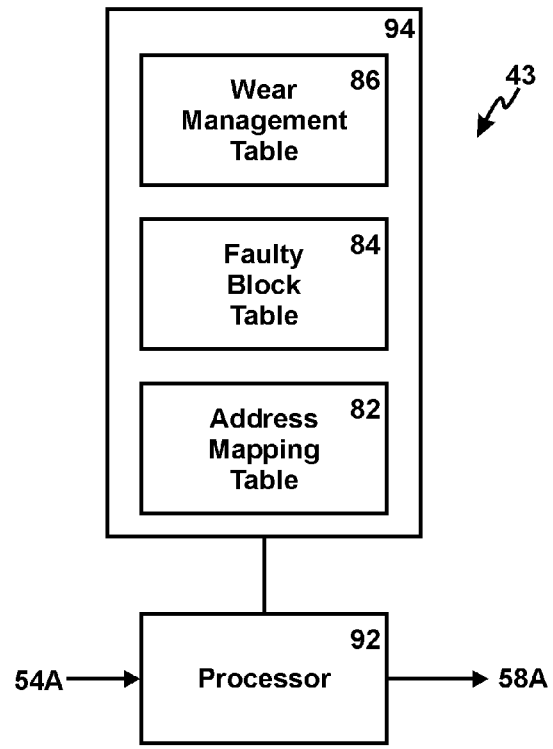
FIG. 10A is a block diagram of a preferred address translator.
Figure 10B:
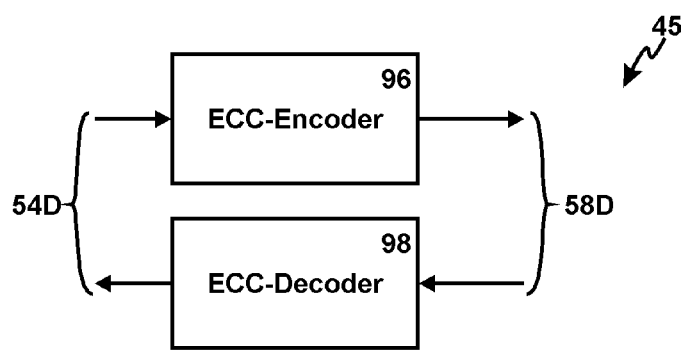
FIG. 10B is a block diagram of a preferred data translator.

Referring now to FIGS. 10A-10B, components of an A/D-translator, i.e. address translator 43 and data translator 45, are disclosed. FIG. 10A discloses a preferred address translator 43. It converts the logical address 54A it receives from the host to the physical address 58A of a 3D-array die. The address translator 43 comprises a processor 92 and a memory 94. The memory 94 stores at least an address mapping table 82, a faulty block table 84 and a wear management table 86. These tables 82, 84, 86 are permanently stored in a read-only memory (ROM), which could a non-volatile memory (NVM) such as flash memory. During operation, these tables 82, 84, 86 are loaded into a random-access memory (RAM) for faster access. When a single A/D-translator die 40* supports multiple 3D-array dies (e.g. 30a, 30b . . . 30w, as shown in FIG. 2C), the memory 94 stores tables 82, 84, 86 for all 3D-array dies supported by the A/D-translator die 40*. In other words, the memory 94 is shared by all 3D-array dies 30a, 30b . . . 30w.

Among tables 82, 84, 86 stored in the memory 94, the address mapping table 82 maintains links between the logical address and the physical address; the faulty block table 84 records the addresses of the faulty blocks in the 3D-M array (s); and the wear management table 88 keeps a log of the number of read/write performed to each block. As used herein, the term "block" refers to an allocation unit of memory and can be any size ranging from a single memory cell to all of the memory cells in a 3D-M array.

During read, upon receiving the input logical address 54A, the processor 94 looks up the address mapping table 82 and fetches the physical address 58A corresponding to the logical address 54A. During write, upon receiving the input logical address 54A, the processor 94 looks up the address mapping table 82, the faulty block table 84 and the wear management table 88 to choose an unused, good and less-used block to write the data. While the processor 94 outputs the physical address 58A of the chosen block, it writes this physical address 58A to the address mapping table 82.

FIG. 10B discloses a preferred data translator 45. It converts the logical data it receives from the host to the physical data of a 3D-array die, or converts the physical data of a 3D-array die to the logical data it outputs to the host. The data translator 45 comprises an ECC-encoder 96 and an ECC-decoder 98. The ECC-encoder 96 encodes the input logical data 54D to the physical data 58D, which are to be stored in the 3D-M array. The ECC-decoder 98 decodes the physical data 58D retrieved from the 3D-M array to the output logical data 54D. During this process, the error bits in the physical data 58D are detected and corrected. The ECC coding algorithms that are suitable for the 3D-M include Reed-Solomon coding, Golay coding, BCH coding, Multi-dimensional parity coding, Hamming coding and others.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A discrete three-dimensional memory (3D-M), comprising:
    a 3D-array die comprising at least a 3D-M array including a plurality of vertically stacked memory levels;
    a peripheral-circuit die comprising at least a portion of a read/write-voltage generator for providing said 3D-array die with at least a read voltage and/or a write voltage other than the voltage supply;
    wherein said portion of said read/write-voltage generator is absent from said 3D-array die; said peripheral-circuit die comprises fewer back-end layers than said 3D-array die, and said 3D-array die and said peripheral-circuit die are separate dice.

2. The discrete 3D-M according to claim 1, wherein said 3D-M comprises a three-dimensional read-only memory (3D-ROM) or a three-dimensional random-access memory (3D-RAM).

3. The discrete 3D-M according to claim 1, wherein said 3D-M comprises at least one of a memristor, a resistive random-access memory (RRAM or ReRAM), a phase-change memory, a programmable metallization cell (PMC), and a conductive-bridging random-access memory (CBRAM).

4. The discrete 3D-M according to claim 1, wherein said read/write-voltage generator comprises a step-up whose output voltage is higher than the voltage supply.

5. The discrete 3D-M according to claim 4, wherein said step-up comprises at least one of a charge pump and a boost converter.

6. The discrete 3D-M according to claim 1, wherein said read/write-voltage generator comprises a step-down whose output voltage is lower than the voltage supply.

7. The discrete 3D-M according to claim 6, wherein said step-down comprises at least one of a low dropout and a buck converter.

8. The discrete 3D-M according to claim 1, further comprising another 3D-M die, wherein said peripheral-circuit die further comprises at least another portion of another read/write-voltage generator for said another 3D-M die, and said another portion of said another read/write-voltage generator is absent from said another 3D-M die.

9. The discrete 3D-M according to claim 1, wherein said 3D-array die and said peripheral-circuit die are located in a memory package, a memory module, a memory card or a solid-state drive.

10. The discrete 3D-M according to claim 1, wherein the array efficiency of said 3D-array die is larger than 40%.

11. A discrete three-dimensional memory (3D-M), comprising:
    a 3D-array die comprising at least a 3D-M array including a plurality of vertically stacked memory levels;
    a peripheral-circuit die comprising at least a portion of a read/write-voltage generator for providing said 3D-array die with at least a read voltage and/or a write voltage other than the voltage supply;

wherein said portion of said read/write-voltage generator is absent from said 3D-array die; said peripheral-circuit die comprises different interconnect materials than said 3D-array die, and said 3D-array die and said peripheral-circuit die are separate dice.

12. The discrete 3D-M according to claim 11, wherein 3D-array die comprises high-temperature interconnect materials.

13. The discrete 3D-M according to claim 11, wherein peripheral-circuit die comprises high-speed interconnect materials.

14. The discrete 3D-M according to claim 11, wherein said 3D-M comprises a three-dimensional read-only memory (3D-ROM) or a three-dimensional random-access memory (3D-RAM).

15. The discrete 3D-M according to claim 11, further comprising another 3D-M die, wherein said peripheral-circuit die further comprises at least another portion of another read/write-voltage generator for said another 3D-M die, and said another portion of said another read/write-voltage generator is absent from said another 3D-M die.

16. The discrete 3D-M according to claim 11, wherein the array efficiency of said 3D-array die is larger than 40%.

17. A discrete three-dimensional memory (3D-M), comprising:
 a 3D-array die comprising at least a 3D-M array including a plurality of vertically stacked memory levels;
 a peripheral-circuit die comprising at least a portion of a read/write-voltage generator for providing said 3D-array die with at least a read voltage and/or a write voltage other than the voltage supply;
 wherein said portion of said read/write-voltage generator is absent from said 3D-array die; said peripheral-circuit die comprises more substrate interconnect layers than said 3D-array die, and said 3D-array die and said peripheral-circuit die are separate dice.

18. The discrete 3D-M according to claim 17, wherein said 3D-M comprises a three-dimensional read-only memory (3D-ROM) or a three-dimensional random-access memory (3D-RAM).

19. The discrete 3D-M according to claim 17, further comprising another 3D-M die, wherein said peripheral-circuit die further comprises at least another portion of another read/write-voltage generator for said another 3D-M die, and said another portion of said another read/write-voltage generator is absent from said another 3D-M die.

20. The discrete 3D-M according to claim 17, wherein the array efficiency of said 3D-array die is larger than 40%.

* * * * *